(12) United States Patent
Matsumoto

(10) Patent No.: US 10,054,466 B2
(45) Date of Patent: *Aug. 21, 2018

(54) ELECTROMAGNETIC INDUCTION SENSOR, OVERLAY MEMBER FOR ELECTROMAGNETIC INDUCTION SENSOR, AND MANUFACTURING METHOD OF ELECTROMAGNETIC INDUCTION SENSOR

(71) Applicant: Wacom Co., Ltd., Saitama (JP)

(72) Inventor: Yoshiharu Matsumoto, Saitama (JP)

(73) Assignee: WACOM CO., LTD., Saitama (JP)

( * ) Notice: Subject to any disclaimer, the term of this patent is extended or adjusted under 35 U.S.C. 154(b) by 57 days.

This patent is subject to a terminal disclaimer.

(21) Appl. No.: 15/262,919

(22) Filed: Sep. 12, 2016

(65) Prior Publication Data

US 2016/0377455 A1     Dec. 29, 2016

Related U.S. Application Data

(63) Continuation of application No. 14/058,040, filed on Oct. 18, 2013, now Pat. No. 9,441,992.

(30) Foreign Application Priority Data

Jul. 26, 2013 (JP) .................................. 2013-155204

(51) Int. Cl.
     *G01B 7/14*      (2006.01)
     *G01D 5/20*      (2006.01)
     (Continued)

(52) U.S. Cl.
     CPC ........... *G01D 5/2073* (2013.01); *G01F 1/582* (2013.01); *G01R 33/0052* (2013.01); *H05K 13/00* (2013.01); *Y10T 29/49155* (2015.01)

(58) Field of Classification Search
     CPC ...... G01F 1/582; H05K 13/00; G01D 5/2073; G01R 33/52
See application file for complete search history.

(56) References Cited

U.S. PATENT DOCUMENTS

| 4,956,526 A | 9/1990 | Murakami et al. |
| 8,350,559 B2 | 1/2013 | Fukushima |
| (Continued) | | |

FOREIGN PATENT DOCUMENTS

| EP | 2 034 395 A2 | 3/2009 |
| EP | 2 372 511 A2 | 10/2011 |
| (Continued) | | |

OTHER PUBLICATIONS

Communication pursuant to Article 94(3) EPC, dated May 19, 2016, for corresponding EP Application No. 14 155 769.4-1568, 5 pages.

(Continued)

*Primary Examiner* — Minh N Tang
(74) *Attorney, Agent, or Firm* — Seed Intellectual Property Law Group LLP

(57) ABSTRACT

Disclosed herein is an electromagnetic induction sensor that is used with a position indicator and includes coils for electromagnetic coupling with the position indicator. The electromagnetic induction sensor includes: a sensor board main body that includes an insulating substrate and a surface sheet attached to a side of a first surface of the insulating substrate, on which side a position is indicated by the position indicator; at least part of conductors forming the coils being formed on a second surface of the insulating substrate opposite from the first surface; and an overlay member that includes a magnetic powder material layer and is adhered to the side of the second surface of the sensor board main body.

19 Claims, 9 Drawing Sheets

(51) Int. Cl.
    *H05K 13/00*     (2006.01)
    *G01F 1/58*     (2006.01)
    *G01R 33/00*     (2006.01)

(56) References Cited

U.S. PATENT DOCUMENTS

| | | | |
|---|---|---|---|
| 9,441,992 B2* | 9/2016 | Matsumoto | G01F 1/582 |
| 2006/0267580 A1 | 11/2006 | Fukushima et al. | |
| 2009/0160790 A1 | 6/2009 | Fukushima et al. | |
| 2012/0306824 A1 | 12/2012 | Horie | |
| 2013/0016073 A1 | 1/2013 | Lee et al. | |
| 2014/0035841 A1 | 2/2014 | Yoo et al. | |
| 2014/0362505 A1 | 12/2014 | Jang et al. | |

FOREIGN PATENT DOCUMENTS

| | | |
|---|---|---|
| EP | 2 533 139 A2 | 12/2012 |
| EP | 2 546 732 A2 | 1/2013 |
| JP | 4-12502 A | 1/1992 |
| JP | 5/158606 A | 6/1993 |
| JP | 8-221176 A | 8/1996 |
| JP | 10-49287 A | 2/1998 |
| JP | 2001-142624 A | 5/2001 |
| JP | 2009-3796 A | 1/2009 |
| JP | 2010-3317 A | 1/2010 |
| JP | 2012-252660 A | 12/2012 |
| TW | 201250566 A1 | 12/2012 |

OTHER PUBLICATIONS

Extended European Search Report, dated Jan. 26, 2015, for corresponding EP Application No. 14155769.4-1558/2830074, 6 pages.

* cited by examiner

F I G. 5

| | MAGNETIC PATH MATERIAL OF RELATED ART | MAGNETIC POWDER MATERIAL LAYER 323 OF EMBODIMENT | ELECTROMAGNETIC SHIELD LAYER 324 OF EMBODIMENT |
|---|---|---|---|
| PERMEABILITY [H/m] | HIGH ($\mu$=1000) | LOW ($\mu$=50 TO 240) | LOW ($\mu$≈1) |
| ELECTRICAL RESISTANCE | LOW (0.1Ω) | HIGH (100Ω) | LOW |
| EFFECT ON AC MAGNETIC FIELD | MAGNETIC PATH PERFORMANCE IS HIGH DUE TO HIGH PERMEABILITY | MAGNETIC PATH PERFORMANCE IS LOW | SHIELD EFFECT BY EDDY CURRENT IS HIGH |
| PROCESSABILITY | PROCESSABILITY IS POOR BECAUSE OF HIGH HARDNESS | PROCESSABILITY IS GOOD | PROCESSABILITY IS GOOD |
| THICKNESS | THIN | SLIGHTLY THICK | THIN |

FIG. 10A
PRIOR ART
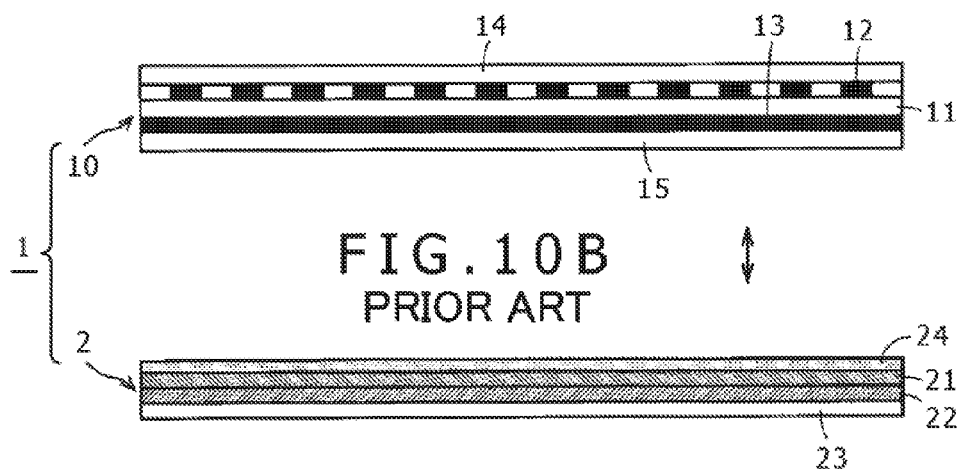
FIG. 10B
PRIOR ART
FIG. 11
PRIOR ART
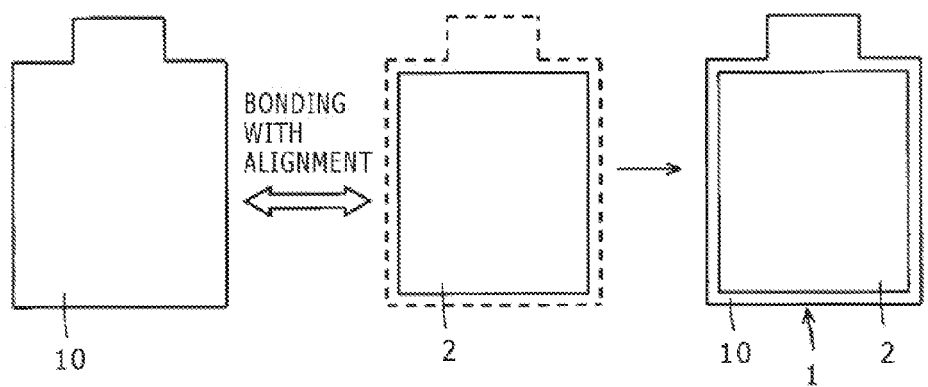

ELECTROMAGNETIC INDUCTION SENSOR, OVERLAY MEMBER FOR ELECTROMAGNETIC INDUCTION SENSOR, AND MANUFACTURING METHOD OF ELECTROMAGNETIC INDUCTION SENSOR

CROSS REFERENCE TO RELATED APPLICATION

The present application claims priority to Japanese Patent Application No. 2013-155204 filed on Jul. 26, 2013, the disclosure of which is hereby incorporated by reference in its entirety.

BACKGROUND OF THE INVENTION

Field of the Invention

The invention relates to an electromagnetic induction sensor, an overlay member for an electromagnetic induction sensor, and a manufacturing method of an electromagnetic induction sensor.

Description of the Related Art

Position detecting devices of an electromagnetic induction system used with a pen-shaped position indicator have been widely used along with popularization of so-called tablet terminals, pad portable terminals, and portable information devices called personal digital assistants (PDA). Furthermore, as the thickness of these electronic apparatuses continues to be reduced, thickness of electromagnetic induction sensors used in the position detecting devices of the electromagnetic induction system is also reduced.

The electromagnetic induction sensor is electromagnetically coupled to the pen-shaped position indicator to detect a position indicated by the position indicator. For this purpose, the position indicator includes a resonant circuit composed of a coil and a capacitor to carry out the electromagnetic coupling with the sensor. The electromagnetic induction sensor includes a coil group to be electromagnetically coupled to the resonant circuit of the position indicator.

The electromagnetic induction sensor is formed of an electromagnetic sheet member called a magnetic path plate, which is adhered to a sensor board, as described in, for example, Patent Document 1 (Japanese Patent Laid-open No. 2009-3796). The electromagnetic sheet member is provided in order to allow utilization of magnetic flux generated from the sensor with as little leakage as possible in electromagnetic coupling between the sensor and a position indicator, and functions as an electromagnetic shield between the sensor and the external.

The sensor is electromagnetically coupled to the position indicator to detect a position indicated by the position indicator in the detection area where the sensor accepts an input of position indication by the position indicator. The detection area of the position indicator is set, for example, as a rectangular area and the position indicated by the position indicator is detected as two-dimensional plane coordinates of the X-axis direction (horizontal direction) and the Y-axis direction (vertical direction).

FIGS. 10A and 10B show the configuration of a related-art sensor. As shown in FIG. 10A, in a sensor board 10 configuring a sensor 1, an X-axis-direction loop coil group 12 is disposed on one surface side of an insulating substrate 11 composed of, for example, polyethylene terephthalate (PET), and a Y-axis-direction loop coil group 13 is disposed on the other surface side. Furthermore, in the example of FIG. 10A, for the sensor board 10, a surface sheet (overlay) 14 formed of, for example, a PET film is so formed as to cover the entirety of the X-axis-direction loop coil group 12, and a protective sheet (overlay) 15 is so formed as to cover the entirety of the Y-axis-direction loop coil group 13.

The overlay is a layer of an insulating material used to wholly or partially wrap and cover a conductor pattern formed on the external surface of a printed wiring board such as the sensor board 10 (See "Denshi Kairo Yougo (Electronic Circuit Terms and Definition)" JPCA-TD01-2008 Japan Electronics Packaging Circuits Association). In the present specification, a member that is or includes an overlay and is integrally joined to (or formed with) a sensor board (a main body of a sensor board, to be described later) to thereby form a sensor will be referred to as an overlay member.

The overlay member configuring the surface sheet 14 and the overlay member configuring the protective sheet 15 are formed by applying an adhesive (not shown) on one surface side of a PET film as the insulating material, for example. Via the adhesive, the overlay members (formed of a PET film, for example) are so adhered to the sensor board 10 as to cover each of the X-axis-direction loop coil group 12 and the Y-axis-direction loop coil group 13. The sensor board 10 is completed when the surface sheet 14 and the protective sheet 15 formed as the overlay members are attached. In this example, a position indicator is so configured that a position indication input is made to the sensor board 10 from the side of the surface sheet 14.

As shown in FIG. 10B, an electromagnetic sheet member 2 called a magnetic path plate includes a first layer 21 forming a magnetic path material and a second layer 22 for electromagnetic shielding. The first layer 21 forming the magnetic path material provides a magnetic path for an alternating magnetic field generated by a loop coil of the loop coil group 12 or 13 in connection with transmission and reception of electromagnetic waves, to thereby prevent diversion of the generated magnetic flux and to enhance the detection sensitivity of the electromagnetic induction sensor 1 regarding the position indicator. The second layer 22 for electromagnetic shielding performs a function to prevent an alternating magnetic field from being radiated to the external toward the side of the protective sheet 15 of the electromagnetic induction sensor 1, and also to prevent electromagnetic waves from the external on the protective sheet 15 side from mixing, as noise, into electromagnetic waves transmitted and received on the side of the surface sheet 14.

As the first layer 21, a layer having high magnetic permeability is used. Specifically, in related arts, magnetic iron plates such as a permalloy plate and a silicon steel plate are used pursuant to recent demands to reduce thickness of the electromagnetic induction sensors. In particular, recently, an amorphous alloy that has permeability as high as, for example, 1000 (H/m) and can be thinned to a thickness as small as, for example, 25 microns is used as the first layer 21 of the magnetic path material. The second layer 22 is formed of a metal material that is a non-magnetic material and has high electrical conductivity, for example, aluminum.

Because the amorphous alloy has extremely low electrical resistance, an eddy current is generated therein due to the magnetic flux applied to the magnetic path material formed as the first layer 21. The eddy current acts to cancel the applied magnetic field. Even considering the disadvantage associated with the generation of the eddy current, all in all the amorphous alloy having high permeability is considered as a high-performance magnetic path plate. Therefore, the amorphous alloy has been used as the magnetic path material to form the first layer 21 thus far.

The electromagnetic sheet member 2 is formed by adhering an aluminum layer as the second layer 22 to a PET film 23 serving as a protective layer, and forming the first layer 21 composed of an amorphous alloy on the second layer 22 composed of aluminum. Furthermore, in the electromagnetic sheet member 2, an adhesive layer 24 is applied on the first layer 21 composed of the amorphous alloy.

The adhesive layer 24 of the electromagnetic sheet member 2 is bonded to the protective sheet 15 of the sensor board 10. Then, as shown in FIG. 11, the electromagnetic sheet member 2 is adhered to the sensor board 10, so that the electromagnetic induction sensor 1 is formed. In this manner, in the related art, the sensor board 10 and the electromagnetic sheet member 2 are separately formed independent of each other and are adhered to each other, to thereby form the electromagnetic induction sensor 1.

BRIEF SUMMARY

As described above, as the magnetic path material forming the electromagnetic sheet member 2 in the related art, an amorphous alloy is used because of the characteristics that it has high magnetic permeability and can be thinned. The amorphous alloy is very hard and is not easy to cut. Furthermore, the amorphous alloy, which has a non-crystalline structure, has large characteristic variation due to difficulty in manufacturing. In the related art, the characteristic variation of the magnetic path material has been a large constraint on enhancement in the detection accuracy of the coordinates of a position indicated by a position indicator on the electromagnetic induction sensor 1.

Furthermore, because of the above-described characteristics of the amorphous alloy (e.g., the amorphous alloy being very hard), the following fabrication method needs to be employed in the related art. Specifically, the amorphous alloy is so selected as to reduce the characteristic variation. The selected amorphous alloy must be cut by a special tool into a predetermined shape, which corresponds to the shape that needs to be adhered to the sensor board 10. Then, to the cut amorphous alloy, the second layer 22 that is composed of aluminum and adhered to the protective layer 23 is adhered, so that the electromagnetic sheet member 2 is pre-formed as a member separate from the sensor board 10.

Meanwhile, as shown in FIG. 11, the sensor board 10 is shaped into a predetermined final form including a lead part and so forth. Then, to the sensor board 10 shaped into the predetermined final form, the electromagnetic sheet member 2 including the amorphous alloy layer 21, which is shaped in conformity to the shape that needs to be adhered to the sensor board 10 and is configured as a separate member, is aligned and bonded via the adhesive layer 24.

That is, in the related art, in view of the difficulty in cutting the amorphous alloy and the characteristic variation of the amorphous alloy, the electromagnetic induction sensor 1 needs to be formed by separately preparing (cutting) the sensor board 10 and preparing the electromagnetic sheet member 2 and bonding the shaped (cut) sensor board 10 and electromagnetic sheet member 2 to each other in accurate alignment.

However, the above-described step of bonding the sensor board 10 and the electromagnetic sheet member 2 to each other is a large obstacle to mass-production of the electromagnetic induction sensor.

In view of the above points, an aspect of the invention is directed to overcoming the difficulty in manufacturing an electromagnetic induction sensor and enabling enhancement in the detection accuracy of the coordinates of a position indicated by a position indicator on the electromagnetic induction sensor.

In order to solve the above-described problems, an embodiment of the invention provides an electromagnetic induction sensor that is used with a position indicator and includes coils for electromagnetic coupling with the position indicator. The electromagnetic induction sensor includes a sensor board main body that includes an insulating substrate and a surface sheet adhered to the side of a first surface of the insulating substrate on which side a position is indicated by the position indicator. At least part of conductors forming the coils is formed on a second surface of the insulating substrate opposite from the first surface of the insulating substrate. The electromagnetic induction sensor further includes an overlay member that has at least a magnetic powder material layer and that is adhered on the side of the second surface of the sensor board main body.

In the embodiment of the invention having the above-described configuration, a magnetic powder material is used as a magnetic path material. The magnetic powder material is included in the overlay member to cover the second surface side of the sensor board main body, on which at least part of the coils for electromagnetic coupling with the position indicator is formed. The overlay member is deposited on (adhered to) the sensor board main body on the second surface side to thereby form the electromagnetic induction sensor.

That is, the embodiment of the invention does not have a configuration like the related art in which the electromagnetic induction sensor (or the sensor board) and the magnetic path material are formed (cut-out) as separate members and thereafter are bonded. Instead, the magnetic path material serves as part of the overlay member of the sensor that is integrally formed with the sensor.

The reason why such configuration is possible is because the magnetic powder material layer composed of the magnetic powder material is used as the magnetic path material. Specifically, the magnetic powder material layer has lower hardness compared with the amorphous alloy layer of the related art and is easy to cut. Therefore, according to the embodiment of the invention, after the overlay member having at least the magnetic powder material layer is deposited on (adhered to) the sensor board main body, the entire (integral) assembly can be easily stamp-cut into a desired shape with a cutter. Thus, the manufacturing becomes easy and the mass productivity is enhanced.

Furthermore, it is easy to form the magnetic powder material layer using the magnetic powder material while minimizing variation in the characteristics thereof. Therefore, according to the electromagnetic induction sensor of the embodiment of the invention, the detection accuracy of the coordinates of a position indicated by the position indicator can be improved.

Moreover, the magnetic powder material can be made not as a good conductor with low resistance like an amorphous alloy in the related art, but as a poor conductor specifically formulated to have high resistance by mixing in a resin. Thus, it is also possible to omit an insulator layer between the second surface side of the sensor board main body and the magnetic powder material layer and instead to directly deposit (adhere) the magnetic powder material layer on (to) the second surface side of the sensor board main body. In this case, because the insulator layer between the second surface side of the sensor board main body and the magnetic powder material layer is unnecessary, correspondingly the thickness can be reduced.

According to the embodiment of the invention, it is possible to provide an electromagnetic induction sensor that overcomes manufacturing difficulty and enables enhancement in the detection accuracy of the coordinates of a position indicated by a position indicator.

Furthermore, the electromagnetic induction sensor according to exemplary embodiments of the invention is integrally formed, wherein the sensor board main body integrally includes the magnetic path material. Thus, the adhesive layer (24 in FIG. 10B) used in the case of separately configuring the sensor board and the magnetic path material and joining them can be omitted in these embodiments, in addition to that the unnecessary overlay (15 in FIG. 10A) can be omitted. Therefore, the thickness of the electromagnetic induction sensor can be reduced.

BRIEF DESCRIPTION OF THE DRAWINGS

FIG. 5 is a table explaining a magnetic path material used in the electromagnetic induction sensor according to the embodiment of the invention in comparison to a related art;

FIGS. 10A and 10B are sectional views of one example of the structure of an electromagnetic induction sensor of the related art; and FIG. 11 is a diagram of an example of a manufacturing method of the electromagnetic induction sensor of the related art.

DETAILED DESCRIPTION

Electromagnetic induction sensors and manufacturing methods thereof according to embodiments of the invention will be described below with reference to the drawings.

First Embodiment

Figure 1A:
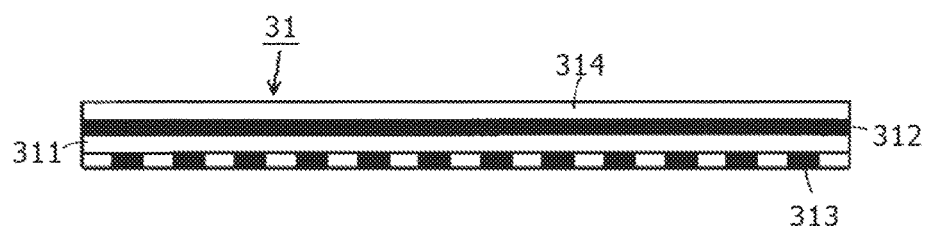
FIGS. 1A to 1C are sectional views of the structure of an electromagnetic induction sensor according to an embodiment of the invention.
Figure 1B:
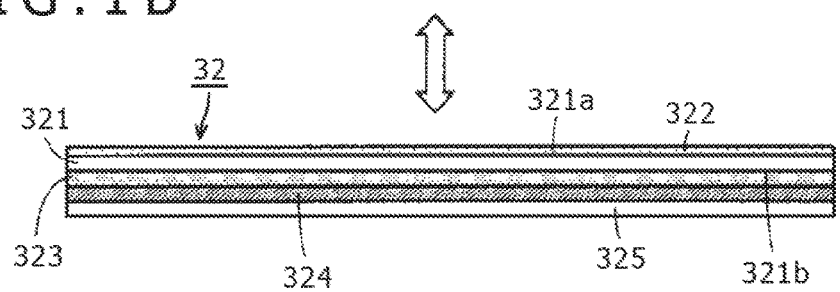
Figure 1C:
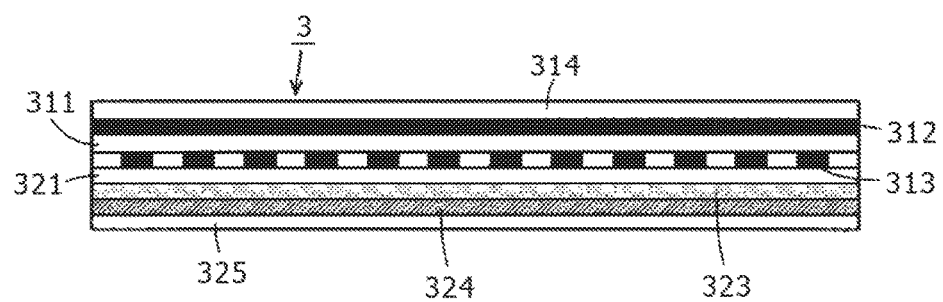

FIGS. 1A to 1C are sectional views showing a configuration example of an electromagnetic induction sensor according to a first embodiment of the invention. An electromagnetic induction sensor 3 of the first embodiment is composed of a sensor board main body 31 shown in FIG. 1A and an overlay member 32 shown in FIG. 1B. The sensor 3 is integrally formed by depositing (adhering) the overlay member 32 on (to) the sensor board main body 31 (see FIG. 1C).

As shown in FIG. 1A, in the sensor board main body 31, an X-axis-direction loop coil group conductor 312 is disposed on one surface side of an insulating substrate 311 composed of, for example, PET and a Y-axis-direction loop coil group conductor 313 is disposed on the other surface side opposite from the one surface. Furthermore, in the example of FIG. 1A, a surface sheet (overlay) 314 formed of, for example, a PET film is so deposited (adhered) as to cover the X-axis-direction loop coil group conductor 312 as a whole. A position indicator is so configured that a position indication input is made to the sensor board main body 31 from the side of the surface sheet 314.

Figure 2:
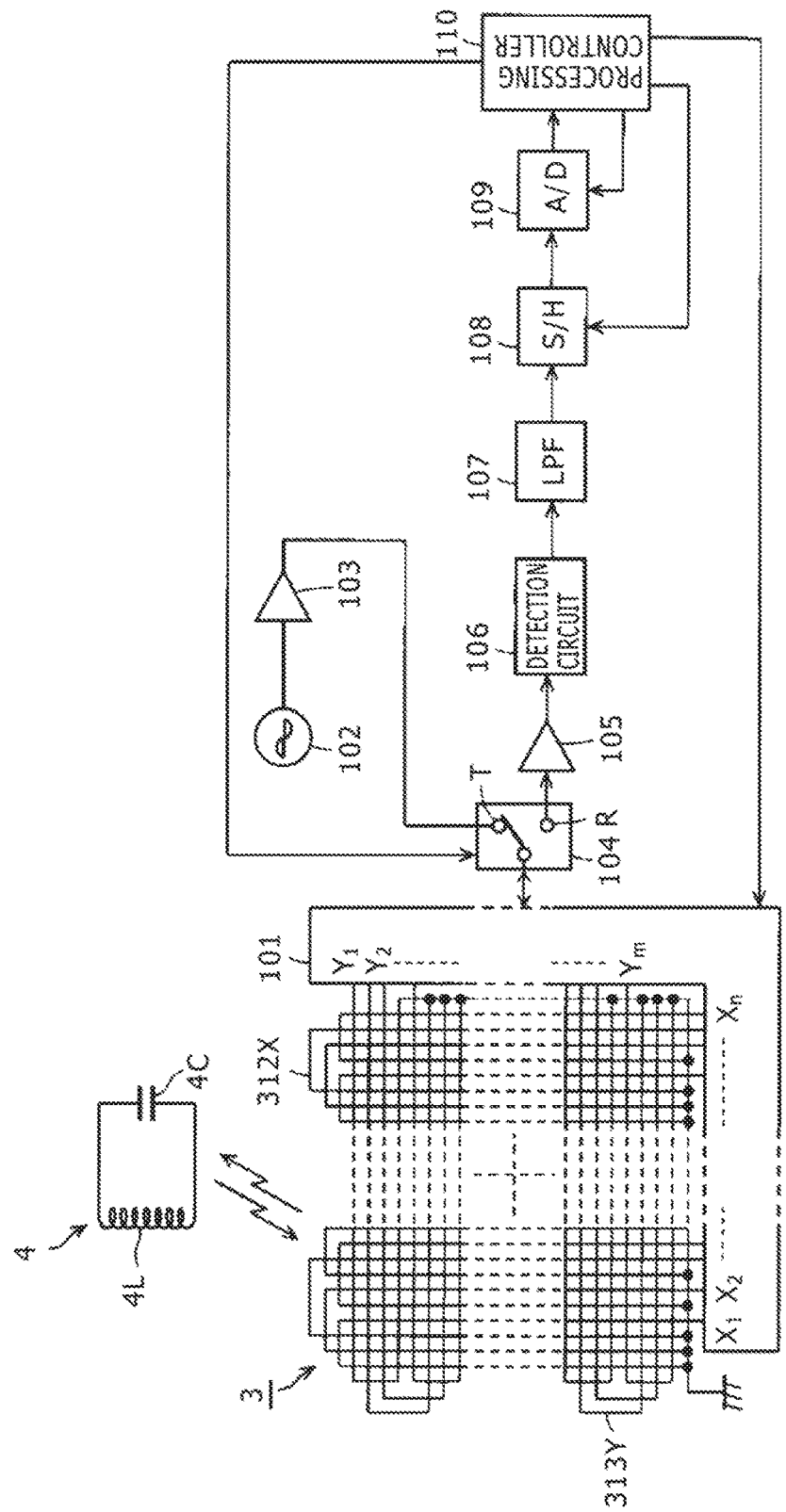
FIG. 2 is a diagram of a position detecting circuit using the electromagnetic induction sensor.

With reference to FIG. 2, an explanation will be made about a configuration to detect a position indicated by the position indicator by the X-axis-direction loop coil group conductor 312 and the Y-axis-direction loop coil group conductor 313 provided in the sensor board main body 31. A position indicator 4, which is used with the electromagnetic induction sensor 3 including the sensor board main body 31, includes a resonant circuit composed of a coil 4L and a capacitor 4C connected in parallel to the coil 4L, as shown in FIG. 2.

As shown in FIG. 2, in the sensor board main body 31, plural rectangular X-axis-direction loop coils 312X forming the X-axis-direction loop coil group conductor 312 are arranged at equal intervals and to sequentially overlap with each other in the horizontal direction (X-axis direction) of the detection area of the indicated position by the position indicator 4. Furthermore, plural rectangular Y-axis-direction loop coils 313Y forming the Y-axis-direction loop coil group conductor 313 are arranged at equal intervals and to sequentially overlap with each other in the vertical direction (Y-axis direction) perpendicular to the horizontal direction of the detection area of the indicated position by the position indicator 4. In this example, n X-axis-direction loop coils 312X are disposed in the X-axis direction and m Y-axis-direction loop coils 313Y are disposed in the Y-axis direction.

A sensor circuit part is provided in the sensor 3. The sensor circuit part includes a selection circuit 101, an oscillator 102, a current driver 103, a transmission/reception switch circuit 104, a receiving amplifier 105, a detection circuit 106, a low-pass filter 107, a sample/hold circuit 108, an analog-to-digital (A/D) conversion circuit 109, and a processing controller 110.

Each of the plural X-axis-direction loop coils 312X and each of the plural Y-axis-direction loop coils 313Y are connected to the selection circuit 101. The selection circuit 101 sequentially selects one loop coil among the plural X-axis-direction loop coils 312X and the plural Y-axis-direction loop coils 313Y in accordance with a control instruction from the processing controller 110.

The oscillator 102 generates an AC signal with a frequency f0. The AC signal is supplied to the current driver 103 to be converted to a current and then sent out to the transmission/reception switch circuit 104. The transmission/reception switch circuit 104 switches the connection target (a transmission-side terminal T or a reception-side terminal R), to which the loop coil 312X or 313Y selected by the selection circuit 101 is connected, every predetermined time under control by the processing controller 110. The current driver 103 is connected to the transmission-side terminal T and the receiving amplifier 105 is connected to the reception-side terminal R.

Therefore, at the time of transmission, the AC signal from the current driver 103 is supplied to the loop coil 312X or 313Y selected by the selection circuit 101 via the transmission-side terminal T of the transmission/reception switch circuit 104. At the time of reception, an induced voltage generated in the loop coil 312X or 313Y selected by the selection circuit 101 is supplied to the receiving amplifier 105 via the selection circuit 101 and the reception-side terminal R of the transmission/reception switch circuit 104 to be amplified and sent out to the detection circuit 106.

The signal detected by the detection circuit 106 is supplied to the A/D conversion circuit 109 via the low-pass filter 107 and the sample/hold circuit 108. The A/D conversion circuit 109 converts an analog signal to a digital signal and supplies it to the processing controller 110.

The processing controller 110 carries out control for position detection. Specifically, the processing controller 110 controls the selection of the loop coil 312X or 313Y in the selection circuit 101, signal switch control in the transmission/reception switch circuit 104, the timing of the sample/hold circuit 108, and so forth.

The processing controller 110 switches the transmission/reception switch circuit 104 to make a connection to the transmission-side terminal T to thereby carry out energization control of the loop coil 312X or 313Y selected by the selection circuit 101 and to make the selected coil send out electromagnetic waves (or generate an alternating magnetic field). The resonant circuit composed of the coil 4L and the capacitor 4C in the position indicator 4 receives the electromagnetic waves sent out from the loop coil 312X or 313Y (or obtains an induced electromotive force from the generated alternating magnetic field) to store energy.

Next, the processing controller 110 switches the transmission/reception switch circuit 104 to make a connection to the reception-side terminal R. Then, an induced voltage is generated in the respective loop coils 312X and 313Y of the X-axis-direction loop coil group conductor 312 and the Y-axis-direction loop coil group conductor 313 by electromagnetic waves transmitted from the position indicator 4. Based on the level of the voltage value of the induced voltage generated in the respective loop coils 312X and 313Y, the processing controller 110 calculates the coordinate values of an indicated position by the position indicator 4 in the detection area of the sensor 3 along the X-axis direction and the Y-axis direction.

Next, the overlay member 32 will be described. As shown in FIG. 1B, the overlay member 32 includes an overlay base film 321 that is composed of an insulator material, for example, PET, on which an adhesive 322 is applied on the side of one surface 321a. A magnetic powder material layer 323 is deposited on the other surface 321b of the overlay base film 321, on which surface the adhesive 322 is not applied. The magnetic powder material layer 323 provides a magnetic path material that forms a magnetic path for an alternating magnetic field generated by the X-axis-direction loop coils 312X and the Y-axis-direction loop coils 313Y of the sensor board main body 31.

In this example, the magnetic powder material layer 323 is formed of a material obtained by mixing powder of a magnetic material having high magnetic permeability, such as powder of an amorphous alloy, with a non-magnetic, non-conductive polymer material, such as resin in this example. In this embodiment, the magnetic powder material is provided in the form of a coating material and the magnetic powder material in the coating-material form is applied over the other surface 321b of the overlay base film 321, on which surface the adhesive 322 is not applied, to thereby create the magnetic powder material layer 323.

Figure 3:
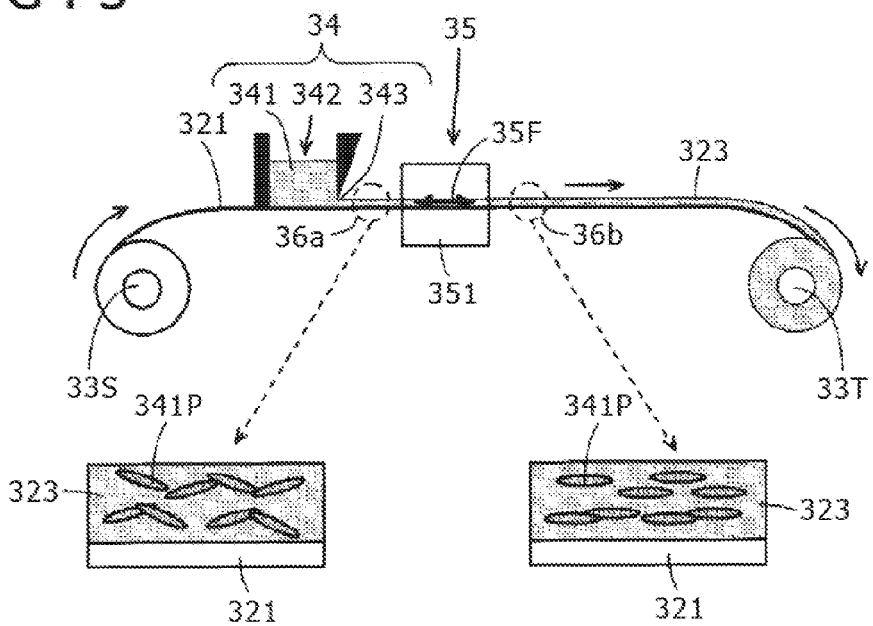
FIG. 3 is a diagram for explaining an overlay member that forms the electromagnetic induction sensor according to the embodiment of the invention.

FIG. 3 shows one example of the method for applying the magnetic powder material layer 323 on the overlay base film 321.

As shown in FIG. 3, the overlay base film 321 is wound around a supply reel 33S and the overlay base film 321 run out from the supply reel 33S is rewound by a take-up reel 33T after the magnetic powder material layer 323 is applied on its one surface side. An application apparatus 34 of the magnetic powder material layer 323 is provided in the middle of the conveyance route of the overlay base film 321 between the supply reel 33S and the take-up reel 33T. The application apparatus 34 includes a reservoir 342 of a magnetic powder paste 341. In addition, although description of a detailed configuration is omitted, the application apparatus 34 includes an application part 343 that applies the magnetic powder paste 341 in the reservoir 342 over the overlay base film 321 to a thickness of, for example, 50 to 100 μm.

The magnetic powder paste 341 is a material formed into a paste form (glue form) by mixing the above-described magnetic powder material composed of, for example, powder of an amorphous alloy with a non-magnetic, non-conductive polymer material composed of, for example, resin. In this example, each magnetic powder piece 341P contained in the magnetic powder material has a flattened shape (see FIG. 3: in FIG. 3, the magnetic powder piece 341P has a flattened elliptical shape).

In this example, in the movement route between the application apparatus 34 and the take-up reel 33T, a magnetic field generating apparatus 35 is provided for aligning the magnetization directions of the magnetic powder pieces 341P contained in the magnetic powder paste 341 to a direction parallel to the film surface of the overlay base film 321, i.e., to a direction perpendicular to the thickness direction of the magnetic powder material layer 323.

In this example, the magnetic field generating apparatus 35 includes a run-through space 351, through which the overlay base film 321 passes, on which the magnetic powder paste 341 has been applied by the application apparatus 34 to form the magnetic powder material layer 323. The magnetic field generating apparatus 35 is so configured as to generate, in its run-through space 351, a magnetic field 35F that is in a direction parallel to the film surface of the overlay base film 321 (i.e., a direction perpendicular to the thickness direction of the magnetic powder material layer 323). It is to be noted that, in this example, the magnetic field generating apparatus 35 generates the magnetic field 35F in a direction parallel to the film surface of the overlay base film 321 and along the extension direction of the film.

The double-headed arrow 35F in the diagram indicates that the magnetic field may be in either orientation as long as the vector of the orientation is in a direction perpendicular to the thickness direction. This means that reversal of the magnetic poles is permitted as long as the N-pole is oriented in either one of the arrow heads and the S-pole is oriented in the other arrow head, as the magnetization directions of a magnetic material or a soft magnetic material.

At a position surrounded by a dotted circle mark 36a in FIG. 3, which is a position before the passage through the magnetic field generating apparatus 35, the flattened surface of each of the flattened magnetic powder pieces 341P contained in the magnetic powder material layer 323 formed by applying the magnetic powder paste 341 on the overlay base film 321 in the application apparatus 34 is oriented in a random direction, as shown at the lower left part in FIG. 3.

Upon passing through the magnetic field 35F in the run-through space 351 of the magnetic field generating apparatus 35, the magnetic powder piece 341P contained in the magnetic powder material layer 323 is magnetized by the magnetic field 35F and magnetic poles are generated at both ends in the major radius direction of the flattened elliptical shape. Thus, the magnetic powder piece 341P is so moved (or oriented) that its magnetization direction, which is the direction of the line coupling the generated magnetic poles at both ends, becomes the same as the direction of the magnetic field 35F. Specifically, at a position surrounded by a dotted circle mark 36b in FIG. 3, which is a position after the passage through the magnetic field generating apparatus 35, the flattened surface of each of the magnetic powder pieces 341P contained in the magnetic powder material layer 323 formed on the overlay base film 321 is so moved as to become parallel to the direction of the magnetic field 35F, so that all the magnetic powder pieces 341P are aligned, as shown in an enlarged diagram at the lower right part in FIG. 3.

Figure 4A:
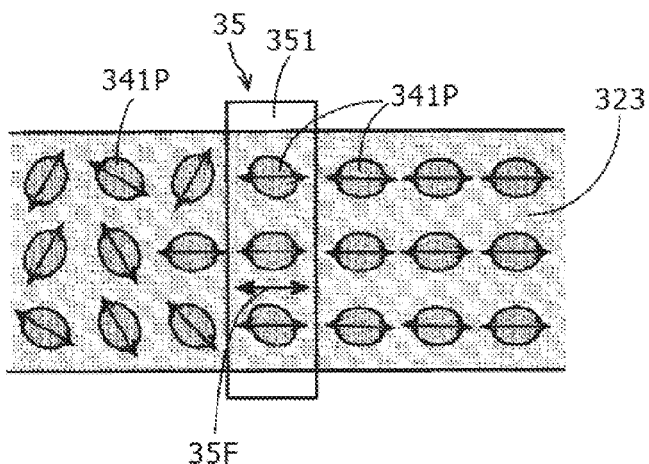
FIGS. 4A and 4B are diagrams for explaining the overlay member that forms the electromagnetic induction sensor according to the embodiment of the invention.
Figure 4B:
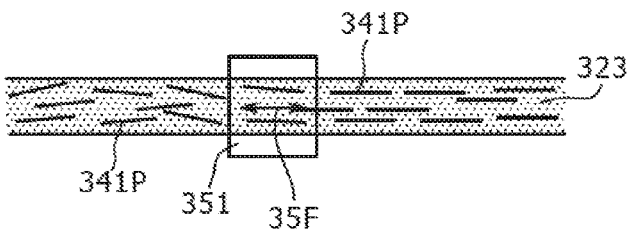

This will be further explained with reference to FIGS. 4A and 4B. FIGS. 4A and 4B are diagrams showing the magnetization directions of the magnetic powder pieces 341P in the magnetic powder material layer 323 before and after the passage through the magnetic field generating apparatus 35. FIGS. 4A and 4B are schematic diagrams for explaining that the magnetization direction of the magnetic powder piece 341P is changed between before and after the magnetic field generating apparatus 35. It should be apparent to those skilled in the art that the depicted relationship between the size of the magnetic powder piece 341P having the flattened elliptical shape and the thickness and width of the magnetic powder material layer 323 may be different from the actual relationship.

Specifically, FIG. 4A is a diagram for explaining the magnetization directions of the magnetic powder pieces 341P (directions of the line coupling the magnetic poles) when the magnetic powder material layer 323 formed on the overlay base film 321 is viewed from the direction perpendicular to the film surface of the overlay base film 321. FIG. 4B is a diagram for explaining the magnetization directions of the magnetic powder pieces 341P (directions of the line coupling the magnetic poles) when the magnetic powder material layer 323 is viewed from a direction perpendicular to its thickness direction.

As shown in FIGS. 4A and 4B, due to the passage through the magnetic field generating apparatus 35, the magnetization direction of each of the magnetic powder pieces 341P contained in the magnetic powder material layer 323 formed on the overlay base film 321 (direction substantially along with the major axis of a flattened elliptical shape shown by the arrow given to each magnetic powder piece 341P in FIG. 4A) is aligned with the same direction as that of the magnetic field 35F, which is in a direction perpendicular to the thickness direction of the magnetic powder material layer 323.

As shown in FIG. 4B, the magnetization directions of all the magnetic powder pieces 341P contained in the magnetic powder material layer 323 are aligned with a direction parallel to the film surface of the overlay base film 321. This can facilitate preventing magnetic flux leakage from the magnetic powder material layer 323. Furthermore, this makes it easy to control the permeability of the magnetic powder material layer, and also to control the thickness of the magnetic powder material layer to achieve optimum permeability.

In the above-described example, the direction of the magnetic field 35F is a direction parallel to the film surface of the overlay base film 321 and is a direction along the extension direction of the film, which is the conveyance direction of the overlay base film 321 when the magnetic powder material layer 323 is formed as shown in FIG. 4A. Therefore, the magnetization directions of the magnetic powder pieces 341P contained in the magnetic powder material layer 323 are also aligned with a direction parallel to the film surface of the overlay base film 321 and a direction along the extension direction of the film. However, it is not necessary for all of the magnetization directions of the magnetic powder pieces 341P to be aligned with the same direction, as long as they are each aligned with a direction parallel to the film surface of the overlay base film 321.

It should be apparent to those skilled in the art that the flattened shape of the magnetic powder piece 341P is not limited to the elliptical shape as depicted above. It may be any shape as long as the magnetization direction can be kept as a direction perpendicular to the thickness direction while the magnetization direction is permitted to reverse its polarities. Typically, the shape may be a needle shape or a bar shape. For example, the magnetic powder may be a soft magnetic material having such a shape that a vector component (primary component) in a certain direction is larger than other vector components perpendicular to this direction. In some embodiments, the primary vector components of a myriad of magnetic powder pieces 341P as statistically measured are aligned with a direction perpendicular to the thickness direction.

In the overlay member 32 of this example, the magnetic powder material layer 323 is formed on the overlay base film 321 in the above-described manner and the adhesive layer 322 is deposited on the other surface of the overlay base film 321, on which the magnetic powder material layer 323 is not formed. An electromagnetic shield layer 324 is deposited on (adhered to) the magnetic powder material layer 323 and a protective sheet 325 is deposited on (adhered to) the electromagnetic shield layer 324. Thereby, the overlay member 32 is configured.

As described above, in the related art, an amorphous alloy with high permeability as the magnetic path material is used as a single (independent) material. The amorphous alloy has high hardness and thus has poor processability. Therefore, the component including the magnetic path material needs to be configured (cut) as an independent member separate from the sensor board using external shape processing in advance, and thereafter the cut magnetic path material needs to be adhered to the sensor board, to which the overlay member has already been adhered. That is, it is very laborious and practically difficult to adhere the magnetic path material composed of an amorphous alloy with poor processability to the overlay member serving as part of the sensor.

In contrast, in the present embodiment, the magnetic powder material layer 323 obtained by mixing powder of a magnetic material having high permeability with a polymer material is used as the magnetic path material. Consequently, the magnetic powder material can be formed as, for example, a coating material as described above, and can be adhered (applied) to the overlay base film 321 in advance to thereby form the overlay member 32, which in turn will integrally form part of the sensor 3.

In addition, as described above, the magnetic powder pieces contained in the magnetic powder material layer 323 formed in the overlay member 32 have a flattened shape and their magnetization directions are aligned with a direction parallel to the film surface of the overlay base film 321 of the overlay member 32 (direction perpendicular to the thickness direction of the magnetic powder material layer 323). This makes it easy to prevent magnetic flux from leaking in the thickness direction (direction perpendicular to the plane surface) and to control the permeability and the thickness of the magnetic powder material layer 323 in the overlay member 32.

The method for adhering the magnetic powder material layer 323 onto the overlay base film 321 is not limited to the method in which the magnetic powder material is formed as a coating material. For example, it is also possible to employ a configuration in which the magnetic powder material is impregnated with an adhesive and the magnetic powder material layer 323 is deposited on the overlay base film 321 and is bonded thereto by the adhesive.

As the magnetic powder material to form the magnetic powder material layer 323, powder of permalloy or ferrite (iron oxide) can also be used instead of powder of an amorphous alloy. Furthermore, the polymer material is not limited to resin and may be either an organic polymer material or an inorganic polymer material. For example, as the organic polymer material, a natural polymer material such as protein, nucleic acid, polysaccharides (cellulose, starch, etc.), and natural rubber and a synthetic polymer material such as synthetic resin, silicone resin, synthetic fiber, and synthetic rubber can be used. As the inorganic polymer material, a natural polymer material such as silicon dioxide (crystal and quartz), mica, feldspar, and asbestos and a synthetic polymer material such as glass and synthetic ruby can be used.

In the overlay member 32, the electromagnetic shield layer 324 is adhered to a surface of the magnetic powder material layer 323. In this example, the electromagnetic shield layer 324 is formed of a metal material, which is a non-magnetic material. The metal material has low resistance (preferably almost zero electrical resistance) and high electrical conductivity in order to generate an eddy current corresponding to the alternating magnetic field from the X-axis-direction loop coils 312X and the Y-axis-direction loop coils 313Y of the sensor board main body 31, so that the alternating magnetic field may be prevented from leaking to the external. In this example, the electromagnetic shield layer 324 is formed of aluminum.

As the method for attaching (adhering) the electromagnetic shield layer 324 composed of aluminum on (to) the magnetic powder material layer 323, besides a method of bonding with an adhesive, for example, a method of pressure bonding or a method of vapor-depositing aluminum on the magnetic powder material layer 323 can be used. In the case of the method of pressure bonding, the magnetic powder material layer 323 may be impregnated with an adhesive.

Furthermore, in the overlay member 32, the protective sheet 325 composed of an insulator such as PET is attached to the electromagnetic shield layer 324 by, for example, an adhesive (not shown). The protective sheet 325 ensures insulation between the sensor 3 and electronic parts on a printed wiring board or the like disposed on the side of the protective sheet 325 of the sensor 3.

In the sensor 3 configured in the above-described manner, the magnetic powder material layer 323 of the magnetic path material has lower permeability and higher electrical resistance compared with a layer composed only of a high-permeability material such as an amorphous alloy, because powder of a high-permeability material such as an amorphous alloy is mixed with a non-magnetic, non-conductive polymer material. Furthermore, it has lower hardness than the amorphous alloy and therefore cutting it is easy.

However, compared with the thickness of the amorphous alloy sheet, which is as small as, for example, 25 μm, the thickness of the magnetic powder material layer 323 may be slightly larger, for example, about 50 to 100 μm. Nonetheless, in accordance with various embodiments, the magnetic powder material layer 323 is applied to form the overlay member 32 that is integrally formed as part of the sensor 3 in advance. That is, differently from the related art, it is not necessary to form (cut out) the electromagnetic sheet member as a separate member and bond it to the sensor board (10 in FIGS. 10A-11), to which an overlay 15 is already adhered via an adhesive (not shown in FIG. 10A). Instead, according to embodiments of the present invention, the overlay member 32 including the magnetic powder material layer 323 is integrally formed with the sensor board main body 31. Thus, there is no need to provide the overlay (protective sheet) 15, on which an adhesive is applied, and to bond the overlay 15, via the adhesive, to the sensor board 10. Correspondingly, the thickness of the sensor board can be reduced. Therefore, even when the thickness of the magnetic powder material layer 323 is larger than that of the amorphous alloy sheet, a thickness equivalent to that of the prior art sensor can be achieved for the sensor 3 as a whole including the magnetic path material (323) and the electromagnetic shield material (324).

FIG. 5 compares the characteristics of the first layer 21 of the electromagnetic sheet member 2 of Patent Document 1 discussed in the background section above, i.e., the magnetic path material (amorphous alloy), and the characteristics of the magnetic powder material layer 323 of the present embodiment. As shown in FIG. 5, the magnetic permeability of the first layer (amorphous alloy) of Patent Document 1 is as high as 1000 [H/m] and thus the first layer provides high performance as the magnetic path for the alternating magnetic field, whereas its electrical resistance is very low. Therefore, as described above, because the electrical resistance is extremely low, the magnetic path material composed of an amorphous alloy has a weakness that an eddy current is generated due to the magnetic flux applied to the magnetic path material and the eddy current acts to cancel the applied magnetic field. Furthermore, the magnetic path material of an amorphous alloy has high hardness and therefore has a problem of poor processability although being excellent in terms of thinness.

In contrast, the magnetic powder material layer 323 of the embodiment has low permeability of about 50 to 240 [H/m] but has a large electrical resistance value of, for example, 100 kΩ, because it is obtained by mixing powder of a magnetic material with a non-magnetic, non-conductive polymer material. Thus, the eddy current that may be generated by the alternating magnetic field is greatly suppressed. Therefore, the alternating magnetic flux can avoid the influence attributed to the eddy current. This allows the magnetic powder material layer 323 to form a desirable magnetic path although its permeability is low.

Therefore, the magnetic powder material layer 323 provides sufficiently high performance as a magnetic flux path for the alternating magnetic field generated by the X-axis-direction loop coils 312X and the Y-axis-direction loop coils 313Y and the alternating magnetic field received from the position indicator. This can favorably maintain the sensitivity of the sensor 3.

However, if the thickness of the magnetic powder material layer 323 of the present embodiment is small, possibly, part of the alternating magnetic field generated by the X-axis-direction loop coils 312X and the Y-axis-direction loop coils 313Y and the alternating magnetic field received from the position indicator may pass through (penetrate) the magnetic powder material layer 323 to leak to the side of the sensor 3 opposite from the surface sheet 314 (i.e., toward the bottom side in FIG. 1C). In the present embodiment, such leakage of the alternating magnetic flux is blocked by disposing the electromagnetic shield layer 324 composed of, for example, aluminum on the magnetic powder material layer 323 and combining it with the magnetic powder material layer 323 in the overlay member 32.

Specifically, the alternating magnetic flux leakage from the magnetic powder material layer 323 is allowable but the leaked alternating magnetic flux is prevented from further leaking from the electromagnetic shield layer 324 to the external due to an eddy current generated in the electromagnetic shield layer 324 having electrical conductivity. Therefore, even when there is an alternating magnetic field leaked from the magnetic powder material layer 323, further leakage to the side opposite from the magnetic powder material layer 323 across (through) the electromagnetic shield layer 324 is prevented. Thus, the alternating magnetic flux due to the alternating magnetic field generated by the X-axis-direction loop coils 312X and the Y-axis-direction loop coils 313Y and the alternating magnetic field received from the position indicator is prevented from leaking to the external of the sensor 3 based on the configuration in which the magnetic powder material layer 323 and the electromagnetic shield layer 324 are combined.

Furthermore, entry of electromagnetic noise from the external of the sensor 3 is prevented by the eddy current generated in the electromagnetic shield layer 324. The material of the electromagnetic shield layer 324 is not limited to aluminum. For example, magnesium alloy, stainless steel (SUS), copper, and alloy thereof (brass etc.) can also be used.

When the magnetic powder material layer 323 has a certain degree of thickness, leakage of the alternating magnetic field is small. Therefore, if a noise generation source such as an electronic circuit does not exist under the sensor 3, it may not be necessary to arrange the electromagnetic shield layer 324. In this case, a configuration equivalent to those shown in FIGS. 7A to 7C and 9E can be used.

The magnetic powder material layer 323 in the sensor 3 of the present embodiment has relatively low hardness and is excellent in processability because it is obtained by mixing powder of a magnetic material with a non-magnetic, non-conductive polymer material. The electromagnetic shield layer 324 also has relatively low hardness and is excellent in processability. Therefore, by utilizing these advantages and employing a configuration in which the magnetic powder material layer 323 and the electromagnetic shield layer 324 are formed in the overlay member 32 in advance, the following manufacturing method of the sensor 3 to be described below in reference to FIG. 6 can be employed, which allows for mass production of the sensor 3.

In some cases the thickness of the magnetic powder material layer 323 is larger than that of the amorphous alloy layer 21 of the related art, as discussed above. However, the magnetic path material 323 is deposited (applied) in the overlay member 32, which is integrally formed as part of the electromagnetic induction sensor 3, according to exemplary embodiments of the invention. Therefore, because various components/layers are integrally formed, it becomes unnecessary to use adhesive layers previously used in the related art to bond together various components/layers that are separately formed in advance, such as an adhesive layer used to bond the protective sheets (14, 15 in FIG. 10A) to the rest of the components/layers. Correspondingly, the thickness of the sensor 3 can be reduced.

Embodiment of Manufacturing Method of Sensor 3

Figure 6:
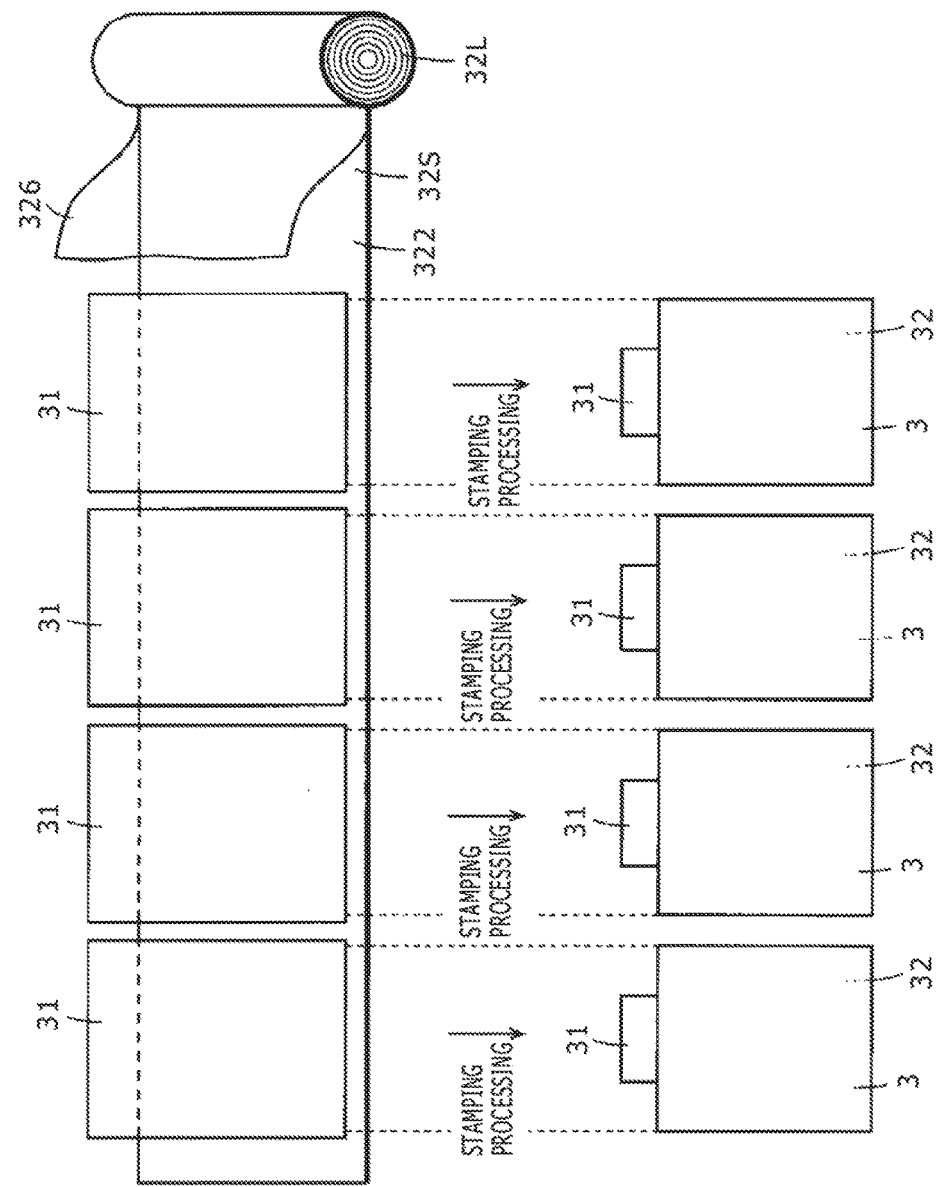
FIG. 6 is a diagram of one example of a manufacturing method of the electromagnetic induction sensor according to an embodiment of the invention.

FIG. 6 is a diagram for explaining a manufacturing method of the sensor 3 according to an embodiment of the present invention. As shown in FIG. 6, in this example, the overlay member 32 is formed into a sheet shape. Then, an overlay member roll 32L obtained by winding a predetermined length of the overlay member sheet 32S is prepared. The overlay member sheet 32S is a component obtained by adhering release paper 326 to the adhesive layer 322, which is in turn adhered to the one surface 321a of the overlay base film 321 in the overlay member 32 having the configuration shown in FIG. 1B.

As shown in FIG. 6, the overlay member sheet 32S drawn out from the overlay member roll 32L is in the state in which the adhesive layer 322 is exposed when the release paper 326 is peeled off.

The X-axis-direction loop coil group conductors 312 and the Y-axis-direction loop coil group conductors 313 are formed on the front and back surfaces of the insulating substrates 311 and the surface sheet 314 is adhered (applied) to form the sensor board main bodies 31 (see FIG. 1A). In this case, although being subjected to external shape processing (cutting), the sensor board main bodies 31 (as shown in FIG. 6) do not need to be processed into a final outer shape with high accuracy and are formed into parts having some dimensional tolerance or margin. However, although not shown in FIG. 6, a position reference mark useful for processing into final outer shape dimensions with high accuracy is formed on each of the sensor board main bodies 31 in an externally recognizable form.

Then, the sensor board main bodies 31 formed in the above-described manner are disposed on the adhesive layer 322 of the overlay member sheet 32S with the side of the Y-axis-direction loop coil group conductors 313 made to face the adhesive layer 322, and are bonded to the overlay member sheet 32S. At this time, in reference to the above-described position reference mark, alignment is so performed that the overlay member 32 comes to have a predetermined positional relationship with the sensor board main body 31.

Then, in the present embodiment of the manufacturing method, the sensor board main bodies 31 deposited on the overlay member sheet 32S are conveyed to below a cutter (not shown) to undergo stamping processing according to the final outer shape of the sensor 3. After alignment is performed with respect to the cutter for stamping processing in reference to the position reference mark, stamp-cutting processing is performed by the cutter so that the sensor board main bodies 31 adhered to the overlay member sheet 32S may be formed into the final outer shape. Thereby, the sensors 3 are formed, in which the overlay members 32 are adhered to the sensor board main bodies 31.

In this case, if plural cutters for stamping processing are arranged in parallel, plural sensors 3 can be simultaneously manufactured.

In the above-described manner, in the manufacturing method of a sensor according to the present embodiment, the sensor 3 can be manufactured by simpler steps as compared with the related art. Specifically, in the related art, the sensor needs to be manufactured as follows. The sensor board and the electromagnetic sheet member are separately fabricated to separately undergo outer shape processing (e.g., cutting). Thereafter, the step of bonding the cut sensor board to the cut electromagnetic sheet member is carried out. Therefore, the manufacturing steps are complicated and mass production is difficult.

In contrast, according to the manufacturing method of a sensor in the present embodiment, the sensors 3 can be manufactured by very simple steps of fabricating the sensor board main bodies 31, depositing (adhering) the fabricated sensor board main bodies 31 on (to) the overlay member sheet 32S prepared in advance, and performing stamping processing to the main bodies 31 combined with the overlay member sheet 32S. In addition, in this case, in contrast to the related art in which a special cutting step is required for the electromagnetic sheet member because of hardness of the amorphous alloy used as the magnetic path material, stamping processing can be easily performed by using a stamp-cutter because the magnetic path material is formed by a magnetic powder material layer. Therefore, the manufacturing method is suitable for mass production.

Furthermore, in the sensor 3 of the present embodiment, the magnetic powder material whose permeability is not as high as that of an amorphous alloy is used as the magnetic path material. Therefore, even when a geomagnetic sensor (Hall element or the like) that detects DC magnetic flux due to a DC magnetic field such as the geomagnetism is located outside the protective sheet 325 of the sensor 3, the geomagnetism can be accurately sensed.

Specifically, when the geomagnetic sensor is provided near the sensor that uses a high-permeability material such as an amorphous alloy as its magnetic path material, in the case of a DC magnetic field such as the geomagnetism, possibly the direction of the DC magnetic flux is changed to pass through the magnetic path material with high permeability and thus the correct direction of the geomagnetism cannot be detected by the geomagnetic sensor.

In contrast, in the sensor 3 of the present embodiment, the permeability of the magnetic powder material forming the magnetic powder material layer 323 can be adjusted to a desired permeability level by adjusting the mixing ratio between the powder of a high-permeability material such as an amorphous alloy and a polymer material. For example, the permeability can be ideally suppressed so that DC magnetic flux due to a DC magnetic field such as the geomagnetism may be essentially prevented from being distorted by the magnetic powder material layer. Moreover, it is also relatively easy to fabricate the magnetic powder material having a desired electrical resistance for the purpose of suppressing a current flow through the magnetic powder material layer 323.

Figure 7A:
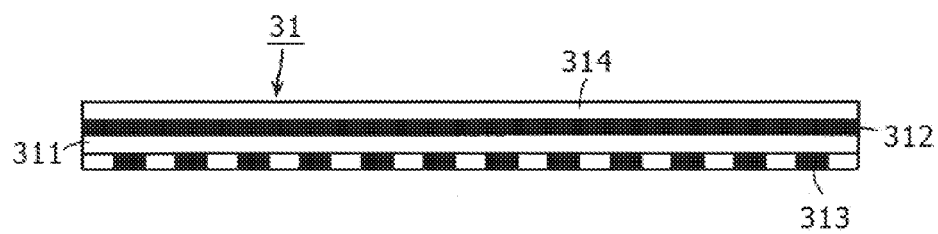
FIGS. 7A to 7C are diagrams of another example of the overlay member forming the electromagnetic induction sensor according to an embodiment of the invention.
Figure 7B:
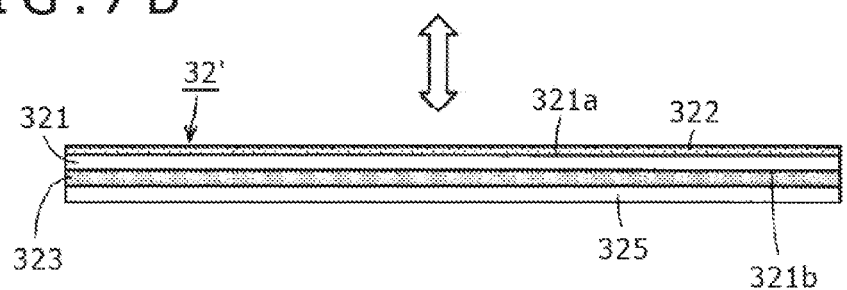
Figure 7C:
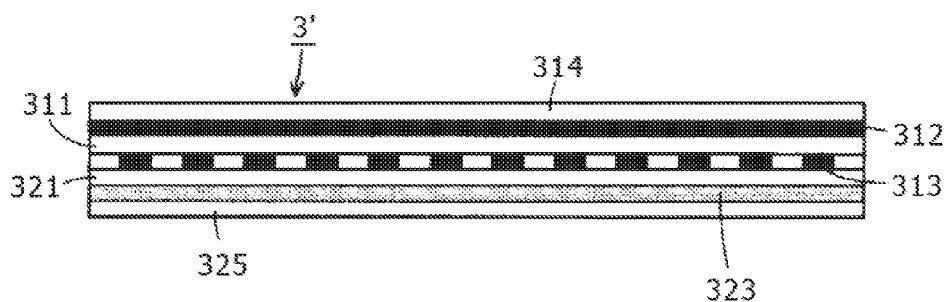

In the above-described first embodiment, the overlay member 32 is configured to include not only the magnetic powder material layer 323 but also the electromagnetic shield layer 324. However, the electromagnetic shield layer 324 need not be provided depending on each application condition such as the particular ambient environment of the place where the electromagnetic induction sensor 3 is set. When the electromagnetic shield member 324 is omitted, to the sensor board main body 31 shown in FIG. 7A (which is the same as 31 in FIG. 1A), an overlay member 32' obtained by removing the electromagnetic shield layer 324 from the overlay member 32 of FIG. 1B is attached as shown in FIG. 7B. This results in formation of a sensor 3' shown in FIG. 7C.

Second Embodiment

In the above-described first embodiment, with respect to the Y-axis-direction loop coil group conductor 313 of the sensor board main body 31, the magnetic powder material layer 323 is deposited (adhered/applied) with the intermediary of an insulating layer formed of the overlay base film 321. However, because the magnetic powder material layer 323 has resistance as high as 100 kΩ as shown in the table of FIG. 5, even when the insulating layer formed of the overlay base film 321 is not provided, there may be practically no influence on the electrical characteristics of the Y-axis-direction loop coil group conductor 313. Thus, the overlay base film 321 may be omitted. By employing the configuration in which the insulating layer formed of the overlay base film 321 is not provided, a sensor can be realized whose thickness is even smaller than that of the sensor 3 of the first embodiment.

The second embodiment provides an electromagnetic induction sensor having such configuration. The same parts as those included in the sensor 3 of the first embodiment are given the same reference numerals and detailed description thereof is omitted.

FIGS. 8A to 8D are diagrams for explaining an electromagnetic induction sensor 5 of the second embodiment and a manufacturing method therefor.

Figure 8A:
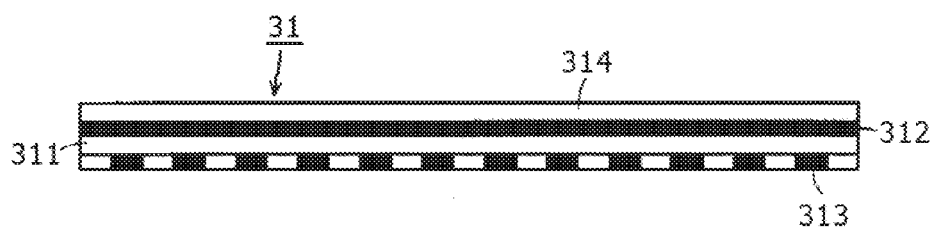
FIGS. 8A to 8D are sectional views of the structure of an electromagnetic induction sensor according to another embodiment of the invention.
Figure 8B:
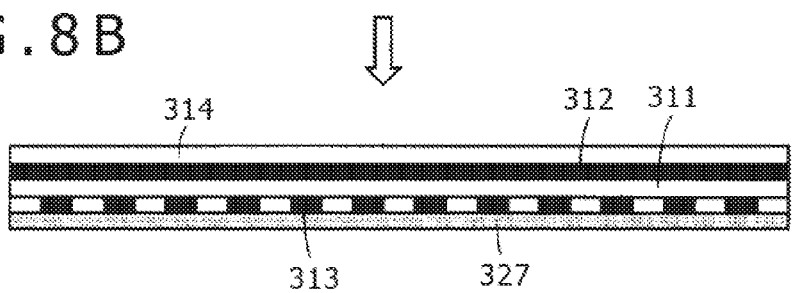
Figure 8C:
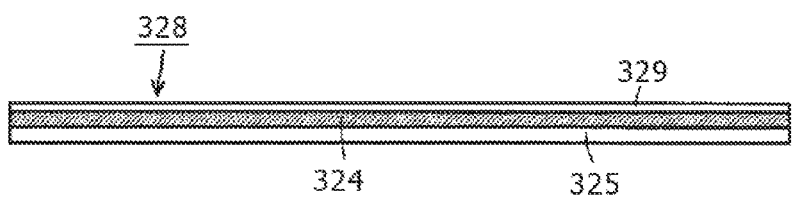
Figure 8D:
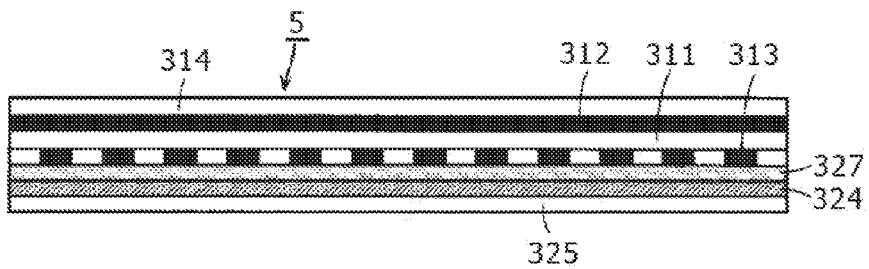

In the second embodiment, first, the sensor board main body 31 is formed just as with the first embodiment as shown in FIG. 8A. Next, as shown in FIG. 8B, a magnetic powder material layer 327 is formed to cover the entirety of the Y-axis-direction loop coil group conductor 313 formed on a surface of the insulating substrate 311 of the sensor board main body 31 on the side opposite from the surface sheet 314.

The magnetic powder material forming the magnetic powder material layer 327 is formulated as a material obtained by mixing powder of a magnetic material having high permeability, for example powder of an amorphous alloy, with a non-magnetic, non-conductive polymer material, for example resin, and is made into a coating material form similarly to the magnetic powder material layer 323 of the first embodiment. The magnetic powder material layer 327 is formed by applying the magnetic powder material having the coating material form in such a manner as to cover the entire surface, on which the Y-axis-direction loop coil group conductor 313 is formed, of the insulating substrate 311 of the sensor board main body 31.

Next, in the second embodiment, a sheet member 328 is obtained by adhering (depositing) the electromagnetic shield layer 324 composed of aluminum, which is an example of a metal material having low resistance and high electrical conductivity, on one surface side of the protective sheet 325. In this case, similarly to the overlay member sheet 32S of the first embodiment, an adhesive layer 329 is applied on the top surface of the electromagnetic shield layer 324 of the sheet member 328 and release paper (not shown) is attached to the adhesive layer 329. Then, a roll sheet is obtained by winding the resulting combination into a roll state.

Then, the release paper of the sheet member 328 drawn out from the roll is peeled off such that the adhesive layer 329 is exposed. Subsequently, the sensor board main body 31, on which the magnetic powder material layer 327 has been applied, is disposed on the sheet member 328 and the magnetic powder material layer 327 is bonded to the adhesive layer 329. It should be apparent to those skilled in the art that alignment similar to that of the first embodiment is performed at this point.

Thereafter, similarly to the first embodiment, the sensor board main body 31 deposited on the sheet member 328 is subjected to stamping processing by a cutter, so that the sensor 5 of the second embodiment is formed.

With the electromagnetic induction sensor 5 of the second embodiment, the same effects as those achieved by the sensor 3 of the above-described first embodiment are achieved. In addition, because the overlay base film 321 composed of an insulator is unnecessary, the thickness of the sensor 5 becomes even smaller than that of the sensor 3 of the first embodiment.

In the case of the second embodiment, the overlay member for covering the Y-axis-direction loop coil group conductor 313 is composed of the protective sheet 325, the electromagnetic shield layer 324 and the magnetic powder material layer 327, with the protective sheet 325 serving as the overlay base film.

Similarly to the above-described first embodiment, the electromagnetic shield layer 324 need not be provided also in the sensor 5 of the second embodiment. Furthermore, the protective sheet 325 may be omitted in both of the case in which the electromagnetic shield layer 324 is provided and the case in which the electromagnetic shield layer 324 is not provided.

In the case of omitting the electromagnetic shield layer 324 and the protective sheet 325, the sensor of the second embodiment can be configured by adhering (depositing) the magnetic powder material layer 327 on the sensor board main body 31 by coating or the like, as shown in FIG. 8B. In this case, the overlay member consists only of the magnetic powder material layer 327. In the case of omitting only the protective sheet 325, the overlay member consists of the magnetic powder material layer 327 and the electromagnetic shield layer 324.

Other Configuration Examples of Overlay Member

In the above-described second embodiment, the magnetic powder material layer 327 is formed on the Y-axis-direction loop coil group conductor 313 arranged on a surface of the insulating substrate 311 of the sensor board main body 31 on the side opposite from the surface sheet side, by directly applying the magnetic powder material in a coating material form over the Y-axis-direction loop coil group conductor 313. However, another method may be employed, in which an overlay member 32A or 32B as shown in FIG. 9A or 9B is prepared and joined to the sensor board main body 31.

Figure 9A:
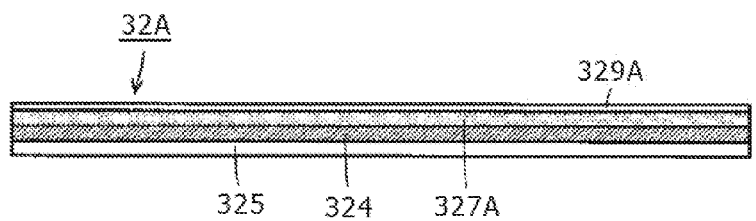
FIGS. 9A to 9E are sectional views of part of the structures of electromagnetic induction sensors according to further embodiments of the invention.

Specifically, in the overlay member 32A of the example of FIG. 9A, the electromagnetic shield layer 324 is adhered to the protective sheet 325, and then a magnetic powder material layer 327A is adhered to the electromagnetic shield layer 324 by coating or the like. Without using the overlay base film 321, an adhesive layer 329A is applied to the magnetic powder material layer 327A, and the overlay member 32A is adhered to the sensor board main body 31 by the adhesive layer 329A.

Figure 9B:
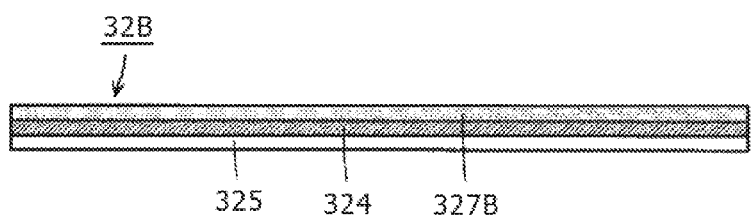

In the overlay member 32B of the example of FIG. 9B, a magnetic powder material layer 327B impregnated with an adhesive is adhered to the electromagnetic shield layer 324 instead of the magnetic powder material layer 327A in the example of FIG. 9A. In the example of FIG. 9B, the sensor board main body 31 and the overlay member 32B can be joined without the adhesive layer 329A, which is necessary in the example of FIG. 9A.

In these examples of FIGS. 9A and 9B, the overlay base film 321 is unnecessary and omitted as with the above-described second embodiment, and thickness reduction for the whole sensor is possible as with the second embodiment.

Figure 9C:
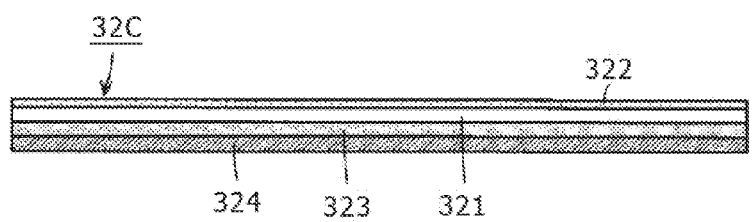

Further examples of the overlay member are not limited to those described in FIGS. 9A and 9B. FIG. 9C shows an overlay member 32C of yet another example. The overlay member 32C of this example is equivalent to a component obtained by removing the protective sheet 325 from the overlay member 32 of the first embodiment. That is, in the overlay member 32C of this example, the protective sheet 325 is omitted on the assumption that an object with which the sensor must not be in electrical contact does not exist on the side opposite from the surface sheet 314 of the sensor. The adhesive layer 322 is formed on the surface of the overlay base film 321 on the side that attaches to the sensor board main body 31, and the magnetic powder material layer 323 is adhered to a surface of the overlay base film 321 on the opposite side. The electromagnetic shield layer 324 is adhered to the magnetic powder material layer 323. In the overlay member 32C of this example, the electromagnetic shield layer 324 is exposed.

All of the overlay members 32A, 32B, and 32C of the above-described examples are examples that have the overlay base film (protective sheet 325 or film 321). Examples to be described below are examples of the overlay member from which the overlay base film is omitted.

The magnetic powder material layer 323 formed by being applied over the overlay base film 321, as shown in FIG. 3, can be separated from the overlay base film 321 after being dried, to thereby form a sheet member. Two examples described below are examples of the case in which the magnetic powder material layer is configured as a sheet member.

Figure 9D:
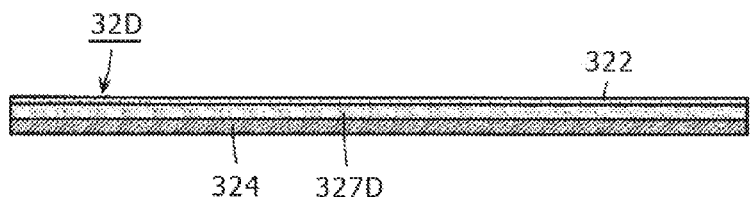

An overlay member 32D of the example shown in FIG. 9D does not have the overlay base film, and includes a magnetic powder material layer 327D formed as a sheet member. The adhesive layer 322 is formed on the surface of the magnetic powder material layer 327D on the side that attaches to the sensor board main body 31, and the electromagnetic shield layer 324 is adhered to the surface of the magnetic powder material layer 327D on the opposite side. In the overlay member 32D of this example, the electromagnetic shield layer 324 is exposed to the external.

Figure 9E:
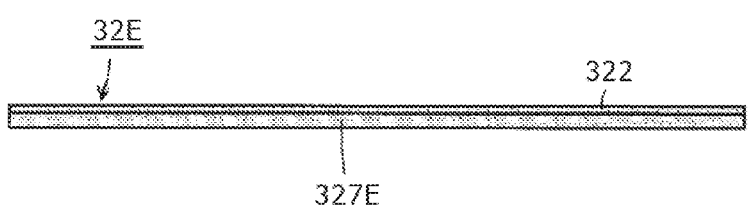

An overlay member 32E of the example shown in FIG. 9E does not have the overlay base film, and includes a magnetic powder material layer 327E formed as a sheet member. The adhesive layer 322 is formed on the surface of the magnetic powder material layer 327E on the side that attaches to the sensor board main body 31, and the overlay member 32E does not include the electromagnetic shield layer. In the case of this example of FIG. 9E, the magnetic powder material layer 327E formed as a sheet member is exposed to the external.

In the overlay members 32D and 32E of the above-described examples of FIGS. 9D and 9E, even when the thickness of the magnetic powder material layer is larger than that of an amorphous alloy layer used in the related art, due to the omission of the overlay base film composed of, for example, PET, the thickness can be reduced corresponding to the thickness of the overlay base film. Thus, thickness reduction for the entire sensor can be achieved.

Other Embodiments and Modification Examples

In the explanation of the above-described embodiments, a material made into a coating material form or a material impregnated with an adhesive is used as the magnetic powder material. However, the magnetic powder material may be provided as a material obtained by mixing powder of a high-permeability amorphous metal or the like with a non-magnetic, non-conductive polymer material, such as resin, and solidifying the mixture. It should be apparent to those skilled in the art that the above-described stamping processing can be similarly performed in this case.

Although the number of processing steps is reduced in the above-described stamping processing, it should be apparent to those skilled in the art that the electromagnetic induction sensor of an embodiment of the present invention may be produced similarly to the related art. For example, a manufacturing method may be used, in which the overlay member 32 is subjected to outer shape processing (cut) in advance and the overlay member 32 that has been subjected to the outer shape processing is attached to the sensor board main body 31, which has been separately subjected to outer shape processing.

Furthermore, it should be apparent to those skilled in the art that the method for joining the overlay member to the sensor board main body 31 is not limited to the examples of the above-described embodiments. For example, the respective layers and sheets forming the overlay member may be sequentially deposited to the sensor board main body 31. For example, in the second embodiment, the following method may be employed. Specifically, the magnetic powder material is applied over the surface of the insulating substrate 311 of the sensor board main body 31 on the side the Y-axis-direction loop coil group conductor 313 is arranged so as to cover the conductor 313 to thereby form the magnetic powder material layer 327. Thereafter, for example, aluminum that forms the electromagnetic shield layer 324 is deposited by, for example, pressure bonding or vapor-deposition. The protective sheet 325 is then deposited on the electromagnetic shield layer 324.

In the above-described embodiments, the sensor board main body 31 includes the X-axis-direction loop coil group and the Y-axis-direction loop coil group disposed along directions perpendicular to each other. However, the position indicated by the position indicator does not need to be based on two-dimensional coordinates. For example, if it is enough that a one-dimensional coordinate can be detected, one loop coil group may be disposed only in the one-dimensional coordinate direction.

In the case of disposing a loop coil group only in a one-dimensional coordinate direction (e.g. X direction) or in the case of employing a configuration in which an alternating magnetic field is generated by only a loop coil group disposed in a one-dimensional coordinate direction, it is preferable to set the magnetization direction to a direction that is perpendicular to the thickness direction and is along the one-dimensional coordinate direction.

It should be apparent to those skilled in the art that expressions "perpendicular" and "parallel" in the above explanation do not require being strictly perpendicular and being strictly parallel, and instead encompass states of being almost perpendicular and being almost parallel. That is, it is enough that the magnetic powders contained in the magnetic powder material layer can be so set that the collective magnetization direction of the magnetic powder material layer as a whole is substantially perpendicular (or almost perpendicular) to the thickness direction.

Although the loop coil group conductors are formed on both surfaces of the insulating substrate in the above-described embodiments, it should be apparent to those skilled in the art that the embodiments of the invention can be applied also in an electromagnetic induction sensor in which the loop coil group conductors are formed on only one surface side of the insulating substrate.

Various modifications, combinations, sub-combinations and alterations are possible depending on design requirements and other factors based on the foregoing disclosure within the scope of the appended claims or the equivalents thereof.

What is claimed is:

1. An electromagnetic induction sensor that is used with a position indicator and that includes coils for electromagnetic coupling with the position indicator, the electromagnetic induction sensor comprising:
a sensor board including the coils; and
an overlay member that includes a magnetic powder material layer, the magnetic powder material layer including magnetic powder and defining a layer surface and a thickness direction that extends perpendicularly to the layer surface,
wherein a magnetization direction of the magnetic powder in the magnetic powder material layer extends along the layer surface and perpendicularly to the thickness direction of the magnetic powder material layer.

2. The electromagnetic induction sensor according to claim 1, wherein the overlay member includes the magnetic powder material layer and a shield material formed of a metal layer, and the magnetic powder material layer is arranged closer to the sensor board than the metal layer.

3. The electromagnetic induction sensor according to claim 1, wherein
the overlay member further includes an insulator, one surface thereof being applied with an adhesive, and another surface thereof being applied with the magnetic powder to form the magnetic powder material layer, and
said adhesive of the overlay member is positioned to cover the coils of the sensor board.

4. The electromagnetic induction sensor according to claim 3, wherein the overlay member still further includes a shield material formed of a metal layer, which is adhered to the magnetic powder material layer.

5. The electromagnetic induction sensor according to claim 1, wherein the overlay member includes: (i) the magnetic powder applied on the sensor board to cover the coils, to thereby form the magnetic powder material layer, (ii) a shield material formed of a metal layer and attached to the magnetic powder material layer, and (iii) a protective sheet attached to the shield material.

6. The electromagnetic induction sensor according to claim 5, wherein the shield material is bonded to the magnetic powder material layer by an adhesive.

7. The electromagnetic induction sensor according to claim 5, wherein the shield material is pressure-bonded to the magnetic powder material layer.

8. The electromagnetic induction sensor according to claim 5, wherein the shield material is vapor-deposited onto the magnetic powder material layer.

9. The electromagnetic induction sensor according to claim 1, wherein
the coils for electromagnetic coupling with the position indicator are composed of a first plurality of loop coils disposed in a first direction and a second plurality of loop coils disposed in a second direction perpendicular to the first direction.

10. The electromagnetic induction sensor according to claim 1, wherein the magnetic powder material layer is composed of a mixture material obtained by mixing the magnetic powder having high magnetic permeability with a polymer material for tuning the high magnetic permeability to a predetermined value.

11. The electromagnetic induction sensor according to claim 10, wherein the mixture material is impregnated with an adhesive.

12. The electromagnetic induction sensor according to claim 10, wherein the polymer material is selected from a group consisting of resin, rubber, and fiber.

13. The electromagnetic induction sensor according to claim 10, wherein the magnetic powder having the high magnetic permeability is selected from a group consisting of powder of an amorphous alloy, powder of permalloy, and powder of ferrite.

14. An overlay member for an electromagnetic induction sensor including a sensor board, the sensor board including coils for electromagnetic coupling with a position indicator, the overlay member comprising:
 a magnetic powder material layer defining a layer surface and a thickness direction that extends perpendicularly to the layer surface,
 wherein a magnetization direction of magnetic powder in the magnetic powder material layer extends along the layer surface and perpendicularly to the thickness direction of the magnetic powder material layer.

15. The overlay member for the electromagnetic induction sensor according to claim 14, further comprising a shield material that is formed of a metal layer and is adhered to the magnetic powder material layer.

16. The overlay member for the electromagnetic induction sensor according to claim 14, further comprising:
 an adhesive layer having a first surface adhered to the magnetic powder material layer and having a second surface covered with a release sheet.

17. A manufacturing method of an electromagnetic induction sensor, the manufacturing method comprising:
 providing a sensor board including coils for electromagnetic coupling with the position indicator; and
 placing an overlay member that includes at least a magnetic powder material layer over the sensor board, the magnetic powder material layer defining a layer surface and a thickness direction that extends perpendicularly to the layer surface, wherein a magnetization direction of magnetic powder in the magnetic powder material layer extends along the layer surface and perpendicularly to the thickness direction of the magnetic powder material layer.

18. The manufacturing method of an electromagnetic induction sensor according to claim 17, further comprising:
 stamp-cutting the overlay member placed over the sensor board into a predetermined shape.

19. The manufacturing method of an electromagnetic induction sensor according to claim 17, further comprising:
 adhering a shield material formed of a metal layer to the magnetic powder material layer to thereby form the overlay member; and
 placing the magnetic powder material layer to be closer to the sensor board than the metal layer.

* * * * *